US008901945B2

(12) United States Patent
Zhao et al.

(10) Patent No.: US 8,901,945 B2
(45) Date of Patent: Dec. 2, 2014

(54) TEST BOARD FOR USE WITH DEVICES HAVING WIRELESSLY ENABLED FUNCTIONAL BLOCKS AND METHOD OF USING SAME

(75) Inventors: Sam Ziqun Zhao, Irvine, CA (US); Ahmadreza Rofougaran, Newport Coast, CA (US); Arya Behzad, Poway, CA (US); Jesus Castaneda, Los Angeles, CA (US); Michael Boers, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 558 days.

(21) Appl. No.: 13/149,315

(22) Filed: May 31, 2011

(65) Prior Publication Data
US 2012/0212244 A1  Aug. 23, 2012

Related U.S. Application Data

(60) Provisional application No. 61/445,754, filed on Feb. 23, 2011.

(51) Int. Cl.
| G01R 31/00 | (2006.01) |
| G01R 31/302 | (2006.01) |
| G01R 31/28 | (2006.01) |

(52) U.S. Cl.
CPC ........ G01R 31/3025 (2013.01); G01R 31/2889 (2013.01)
USPC ................. 324/750.01; 324/754.31

(58) Field of Classification Search
None
See application file for complete search history.

(56) References Cited

U.S. PATENT DOCUMENTS

| 5,629,838 | A | 5/1997 | Knight et al. |
| 5,877,547 | A | 3/1999 | Rhelimi |
| 5,898,909 | A | 4/1999 | Yoshihara et al. |
| 6,249,242 | B1 | 6/2001 | Sekine et al. |
| 6,476,330 | B2 | 11/2002 | Otsuka et al. |
| 6,670,692 | B1 | 12/2003 | Tu et al. |
| 6,942,157 | B2 | 9/2005 | Nozawa et al. |
| 7,479,841 | B2 | 1/2009 | Stenger |
| 7,525,199 | B1 | 4/2009 | Lauterbach et al. |
| 7,671,806 | B2 | 3/2010 | Voigtlaender |
| 7,997,501 | B2 | 8/2011 | Ikemoto et al. |
| 8,290,446 | B2 | 10/2012 | Rofougaran |
| 2002/0179721 | A1 | 12/2002 | Elbaz et al. |

(Continued)

FOREIGN PATENT DOCUMENTS

| CN | 101095261 A | 12/2007 |
| CN | 101212232 A | 7/2008 |

(Continued)

OTHER PUBLICATIONS

Office Action mailed Dec. 22, 2001, in U.S. Appl. No. 13/022,277, Zhao et al., filed Feb. 7, 2011.

(Continued)

*Primary Examiner* — Minh N Tang
(74) *Attorney, Agent, or Firm* — Sterne, Kessler, Goldstein & Fox PLLC

(57) ABSTRACT

A test board is provided. The test board includes a test module configured to accommodate an integrated circuit (IC) device and first wirelessly enabled functional blocks located in the test module and configured to communicate with second wirelessly enabled functional blocks of the IC device.

20 Claims, 8 Drawing Sheets

(56) References Cited

U.S. PATENT DOCUMENTS

| | | | |
|---|---|---|---|
| 2003/0100200 | A1 | 5/2003 | Franzon et al. |
| 2004/0100781 | A1 | 5/2004 | Bozso et al. |
| 2005/0075080 | A1 | 4/2005 | Zhang |
| 2005/0225481 | A1 | 10/2005 | Bonthron |
| 2006/0176851 | A1 | 8/2006 | Bennett et al. |
| 2006/0285480 | A1* | 12/2006 | Janofsky ............... 370/208 |
| 2007/0065984 | A1 | 3/2007 | Lau et al. |
| 2007/0235864 | A1 | 10/2007 | Megahed |
| 2007/0267725 | A1 | 11/2007 | Lee et al. |
| 2007/0298730 | A1 | 12/2007 | Tandy |
| 2008/0122726 | A1 | 5/2008 | Levi et al. |
| 2008/0159243 | A1 | 7/2008 | Rofougaran |
| 2008/0181252 | A1 | 7/2008 | Rofougaran |
| 2008/0237843 | A1 | 10/2008 | Gupta et al. |
| 2008/0252543 | A1 | 10/2008 | Pettus |
| 2008/0274712 | A1 | 11/2008 | Rofougaran |
| 2008/0315375 | A1 | 12/2008 | Eichelberger et al. |
| 2008/0316106 | A1 | 12/2008 | Voigtlaender |
| 2008/0316126 | A1 | 12/2008 | Voigtlander |
| 2008/0317402 | A1 | 12/2008 | Kodama et al. |
| 2009/0006675 | A1 | 1/2009 | Rofougaran |
| 2009/0072843 | A1 | 3/2009 | Slupsky et al. |
| 2009/0125746 | A1 | 5/2009 | Rofougaran |
| 2009/0153427 | A1 | 6/2009 | Rofougaran |
| 2009/0227205 | A1 | 9/2009 | Rofougaran |
| 2009/0262290 | A1 | 10/2009 | Sampica et al. |
| 2009/0266900 | A1 | 10/2009 | Ikemoto et al. |
| 2009/0278760 | A1 | 11/2009 | Kimura et al. |
| 2009/0289343 | A1 | 11/2009 | Chiu et al. |
| 2009/0315797 | A1 | 12/2009 | Rofougaran et al. |
| 2009/0318105 | A1 | 12/2009 | Rofougaran et al. |
| 2010/0035370 | A1 | 2/2010 | Ding et al. |
| 2010/0060478 | A1 | 3/2010 | Joe |
| 2010/0141536 | A1 | 6/2010 | Zhang et al. |
| 2010/0219513 | A1* | 9/2010 | Zhang et al. ............... 257/659 |
| 2011/0024889 | A1 | 2/2011 | Hata |
| 2011/0316139 | A1 | 12/2011 | Zhao et al. |
| 2012/0086114 | A1 | 4/2012 | Zhao et al. |
| 2013/0082363 | A1 | 4/2013 | Zhao et al. |

FOREIGN PATENT DOCUMENTS

| | | |
|---|---|---|
| EP | 0 887 861 A1 | 12/1998 |
| EP | 0 932 200 A2 | 7/1999 |
| EP | 2 012 258 A1 | 1/2009 |
| JP | 2008251768 A * | 10/2008 |
| KR | 10-2009-0096526 | 9/2009 |
| WO | WO 2008/065640 | 5/2008 |

OTHER PUBLICATIONS

Office Action mailed Dec. 22, 2001, in U.S. Appl. No. 13/022,291, Zhao et al., filed Feb. 7, 2011.

Co-pending U.S. Appl. No. 13/249,885 inventors Zhao et al., filed Sep. 30, 2011 (Not Published).

Co-pending U.S. Appl. No. 13/022,291 inventors Zhao et al., filed Feb. 7, 2011 (Not Published).

Chang et al., "RF-Interconnect for Future Inter- and Intra-ULSI Communications," International Electron Devices Meeting 2001, Technical Digest, pp. 537-540, Dec. 2, 2001.

Final Office Action mailed Jul. 31, 2012, in U.S. Appl. No. 13/022,277, Zhao et al., filed Feb. 7, 2011.

Non-Final Office Action mailed Jan. 22, 2013, in U.S. Appl. No. 13/022,277, Zhao et al., filed Feb. 7, 2011.

Non-Final Office Action mailed Jul. 22, 2013, in U.S. Appl. No. 13/022,277, Zhao et al., filed Feb. 7, 2011.

Final Office Action mailed Aug. 6, 2012, in U.S. Appl. No. 13/022,291, Zhao et al., filed Feb. 7, 2011.

Non-Final Office Action mailed Jan. 16, 2013, in U.S. Appl. No. 13/022,291, Zhao et al., filed Feb. 7, 2011.

Final Office Action mailed Jul. 19, 2013, in U.S. Appl. No. 13/022,291, Zhao et al., filed Feb. 7, 2011.

English language abstract for EP 0 877 861 A1, published Dec. 30, 1998, provided by Espacenet, 2 pages.

English language abstract for KR 10-2009-0096526, published Sep. 10, 2009, provided by Espacenet, 2 pages.

European Search Report, dated Jul. 25, 2013, for European Appl. No. 11005016.8, 8 pages.

European Search Report, dated Apr. 17, 2013, for European Appl. No. 11008016.3, 8 pages.

European Search Report, dated Feb. 4, 2013, for European Appl. No. 12005675.9, 5 pages.

Office Action for Related Chinese Patent Application No. 2011101710023, mailed May 27, 2013; 10 pages.

Communication from the Examining Division of the European Patent Office directed to related European Patent Application No. 11 008 116.3, Munich, Germany, mailed Aug. 21, 2013; 7 pages.

Communication from the Examining Division of the European Patent Office directed to related European Patent Application No. 12 005 675.9, Munich, Germany, mailed Sep. 3, 2013; 4 pages.

Non-Final Office Action for U.S. Appl. No. 13/249,885, mailed Feb. 21, 2014; 12 pages.

Non-Final Office Action for U.S. Appl. No. 13/022,291, mailed Feb. 25, 2014; 26 pages.

Final Office Action for U.S. Appl. No. 13/022,277, mailed Feb. 27, 2014; 28 pages.

* cited by examiner

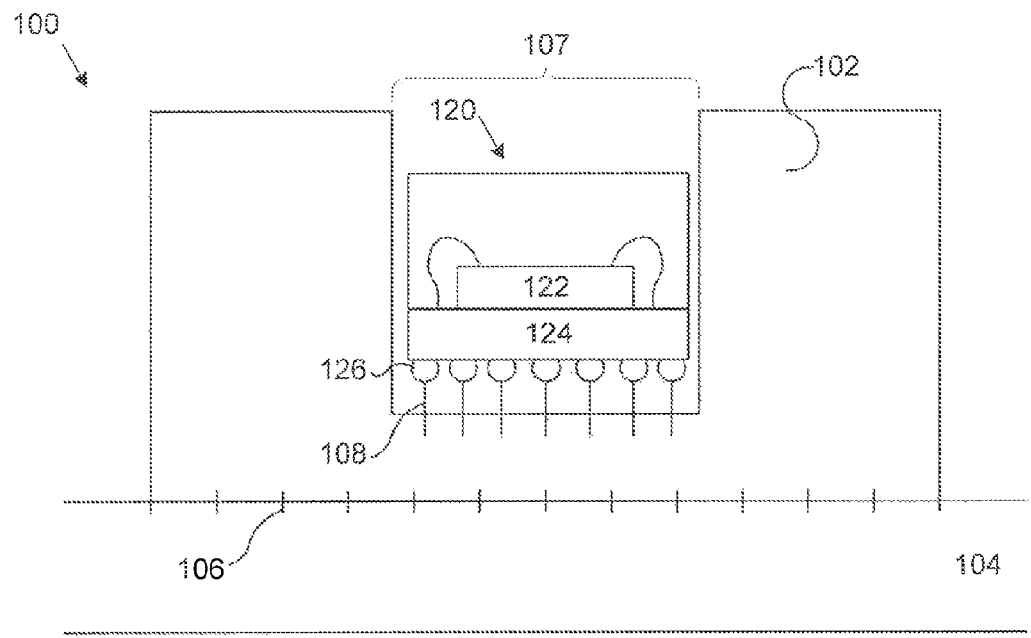
FIG. 1
Conventional

TEST BOARD FOR USE WITH DEVICES HAVING WIRELESSLY ENABLED FUNCTIONAL BLOCKS AND METHOD OF USING SAME

CROSS REFERENCE TO RELATED APPLICATIONS

This application claims the benefit of U.S. Provisional Appl. No. 61/445,754, filed Feb. 23, 2011, which is incorporated by reference herein in its entirety.

BACKGROUND

1. Field

The present invention relates to test boards for integrated circuit devices.

2. Background

Integrated circuit (IC) device test boards test IC devices by transmitting signals to the IC device and recording responses from the IC device. The responses can be compared to expected responses to determine whether the IC device is operating properly. To send signals to and receive signals from the IC device, the IC device can be inserted into a socket of the test board. The socket can include pins (or other connection elements) that contact connection elements of the IC device (e.g., leads, pins, solder balls, etc.). The socket's pins can be used to send signals to particular ones of the IC device's connection elements.

To send signals to and receive signals from an IC device, conventional test boards rely on establishing physical contact with external conductive elements of the IC device. These test boards, however, cannot be used to test IC devices that do not have external connective elements.

BRIEF SUMMARY

In embodiments described herein, a test board is provided. The test board includes a test module configured to accommodate an IC device and first wirelessly enabled functional blocks located in the test module and configured to communicate with second wirelessly enabled functional blocks of the IC device.

In another embodiment, a method of testing an IC device is provided. The method includes receiving the IC device in a test module of a test board, the test module including first wirelessly enabled functional blocks and the IC device including second wirelessly enabled functional blocks, transmitting a signal to at least one of the second wirelessly enabled functional blocks with at least one of the first wirelessly enabled functional blocks, and evaluating a response to the signal generated by the IC device to determine whether the IC device is operating properly.

These and other advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 1 shows a cross-sectional view of a conventional test board.

Figure 2:
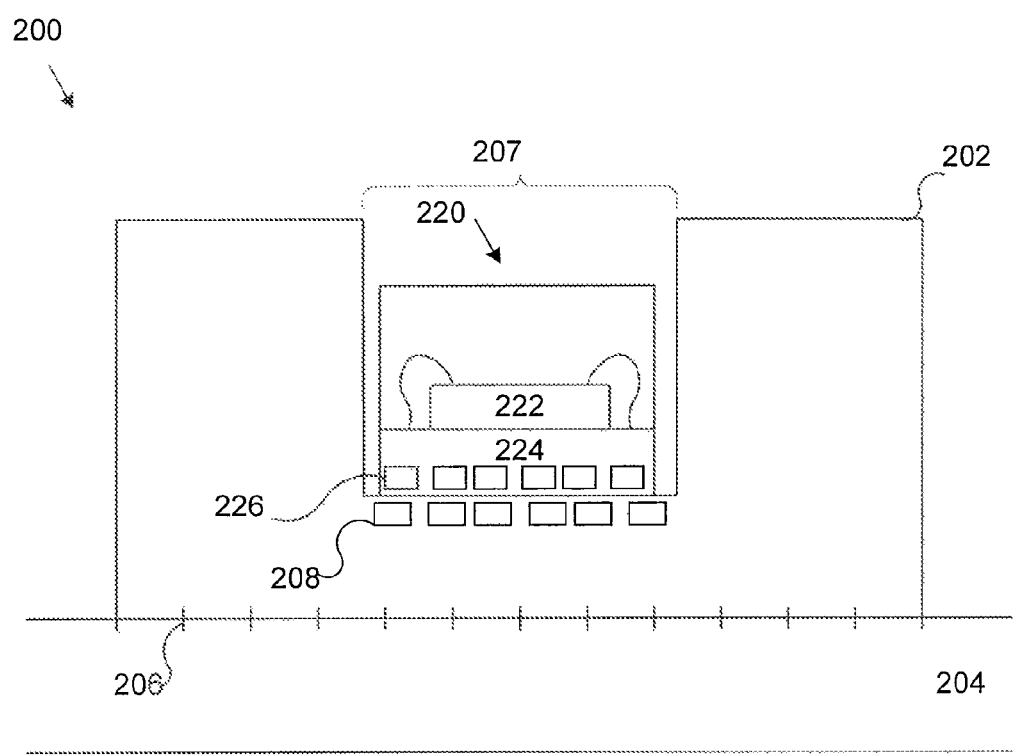
FIG. 2 shows a cross-sectional view of a test board, according to an embodiment of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The foregoing description of the specific embodiments will so fully reveal the general nature of the invention that others can, by applying knowledge within the skill of the art, readily modify and/or adapt for various applications such specific embodiments, without undue experimentation, and without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance herein.

The breadth and scope of the present invention should not be limited by any of the above-described exemplary embodiments, but should be defined only in accordance with the following claims and their equivalents.

Furthermore, it should be understood that spatial descriptions (e.g., "above", "below", "left," "right," "up", "down", "top", "bottom", etc.) used herein are for purposes of illustration only, and that practical implementations of the structures described herein can be spatially arranged in any orientation or manner.

Conventional Test Boards

FIG. 1 shows a cross-sectional view of a test board 100. Test board 100 includes a socket 102 mounted on a circuit board 104. Circuit board 104 includes pins 106 that electrically couple socket 102 to circuit board 104. Test board 100 can be used to test the operation of an IC device 120. In the exemplary embodiment of FIG. 1, IC device 120 includes an IC die 122, a substrate 124, and solder balls 126.

Socket 102 includes a cavity 107 and pins 108. Cavity 107 is configured to house IC device 120. Pins 108 are located in cavity 107. Each of pins 108 is configured to contact a respective one of solder balls 126, thereby electrically coupling IC device 120 to socket 102. Put another way, each pin 108 makes "ohmic contact" with a respective solder ball of solder balls 126. In other embodiments, other types of connection elements besides pins can be used to make ohmic contact with IC device (e.g., posts).

In operation, test board 100 can test IC device 120 by transmitting signals to IC device 120 and recording response signals generated by IC device 120. Specifically, test board 100 can route signals to socket 102 using buses formed on circuit board 104 (not shown in FIG. 1). Pins 106 can transmit the signals to socket 102. From socket 102, pins 108 can transmit the signals to IC device 120. The signals can include power and ground voltages and input/output (I/O) signals. For example, during testing, test board 100 can activate IC device 120 by providing power and ground voltages. Once activated, test board 100 can test IC device 120 by transmitting I/O signals to IC device 120. Responses to the I/O signals generated by IC device 120 can be received by test board 100 through pins 106 and 108 and can be compared against expected responses to determine whether IC device 120 is operating properly.

Test board 100 requires that IC device 120 be in ohmic contact with socket 102. For example, in the embodiment of FIG. 1, this means that pins 108 of socket 102 must contact solder balls 126 of IC device 120. More generally, this means that pins 108 must be in contact with external conductive elements of the IC device being tested (e.g., in the embodiment in which the IC device is a leadframe device, pins 108 would have to be in contact with the IC devices leads). Some IC devices, however, do not have external conductive elements. For example, some IC devices wirelessly communicate with other devices. These devices may not have external conductive elements and therefore cannot be in ohmic contact with socket 102. Test board 100 thus cannot be used to test these types of IC devices. Additionally, IC device 120 can be clamped or pressured against socket 102 so that solder balls 126 can maintain ohmic contact with pins 108. Solder balls 126 can be damaged during the test due to the applied forces from pins 108. Specifically, some or all of solder balls 126 can be exposed to non-uniform forces applied by pins 108, which can result in pins 108 penetrating solder balls 126.

Exemplary Embodiments

In embodiments described herein, a test board is provided that can be used to test an IC device without having to make ohmic contact with the IC device. The test board can include wirelessly enabled functional blocks located in a test module configured to accommodate the IC device. The test module's wirelessly enabled functional blocks can be configured to communicate with respective ones of the IC device's wirelessly enabled functional blocks. The test board can thus be used to test an IC device without having to make ohmic contact with the IC device. Thus, the clamping pressure that is applied to achieve ohmic may not be needed, thereby avoiding the damaging effects that the clamping pressure can have on the IC device.

Different types of test modules can be used to accommodate the IC device. For example, the test board can include sockets that are configured to accommodate the IC device. In another embodiment, the test board can include a platform or other structures that can register the IC device. In still other embodiments, a test board can include a combination of two or more different types of test modules.

FIG. 2 shows a cross-sectional view of a test board 200, according to an embodiment of the present invention. Test board 200 includes a socket 202 and a circuit board 204. Test board 200 can be used to test the operation of an IC device 220.

Socket 202 includes a cavity 207 and first wirelessly enabled functional blocks 208. Cavity 207 is configured to house IC device 220. First wirelessly enabled functional blocks 208 are located in cavity 207 are configured to communicate with IC device 220.

IC device 220 includes an IC die 222, a substrate 224, and second wirelessly enabled functional blocks 226. IC die 222 communicates with outside devices through second wirelessly enabled functional blocks 226. Specifically, IC die 222 is electrically coupled to substrate 224. Substrate 224 includes traces and vias that route signals to second wirelessly enabled functional blocks 226.

Circuit board 204 includes pins 206 that electrically couple socket 202 to circuit board 204. In one embodiment, circuit board 204 is a printed circuit board.

In operation, test board 200 can test IC device 220 by sending signals to IC device 220 and recording response signals generated by IC device 220. Specifically, test board 200 can route signals to socket 202 using buses formed on circuit board 204 (not shown in FIG. 2, shown in FIG. 4). Pins 206 can transmit the signals to socket 202. These signals are received by respective ones of first wirelessly enabled functional blocks 208. First wirelessly enabled functional blocks 208 transmit the signals to respective ones of second wirelessly enabled functional blocks 226 of IC device 220.

Like test board 100, test board 200 can be used to transmit power, ground, and I/O signals to IC device 200. For example, test board 200 can transmit power and ground signals to activate IC device 200. Test board 200 then can transmit I/O signals to IC device 220 and record responses to the I/O signals to determine if IC device 220 is operating properly.

Unlike test board 100, however, test board 200 does not require ohmic contact to test IC device 220. Rather, first wirelessly enabled functional blocks 208 can receive signals and generate corresponding wireless signals. The wireless signals are received by respective ones of second wirelessly enabled functional blocks 226 of IC device 220.

When ohmic contact is needed to test IC devices, testing boards generally are required to have strict registration requirements. That is, testing boards are generally required to be able to align contacts of IC device with the contacts of the test board within relatively strict tolerances so that ohmic contact can be reliably established.

Figure 7:
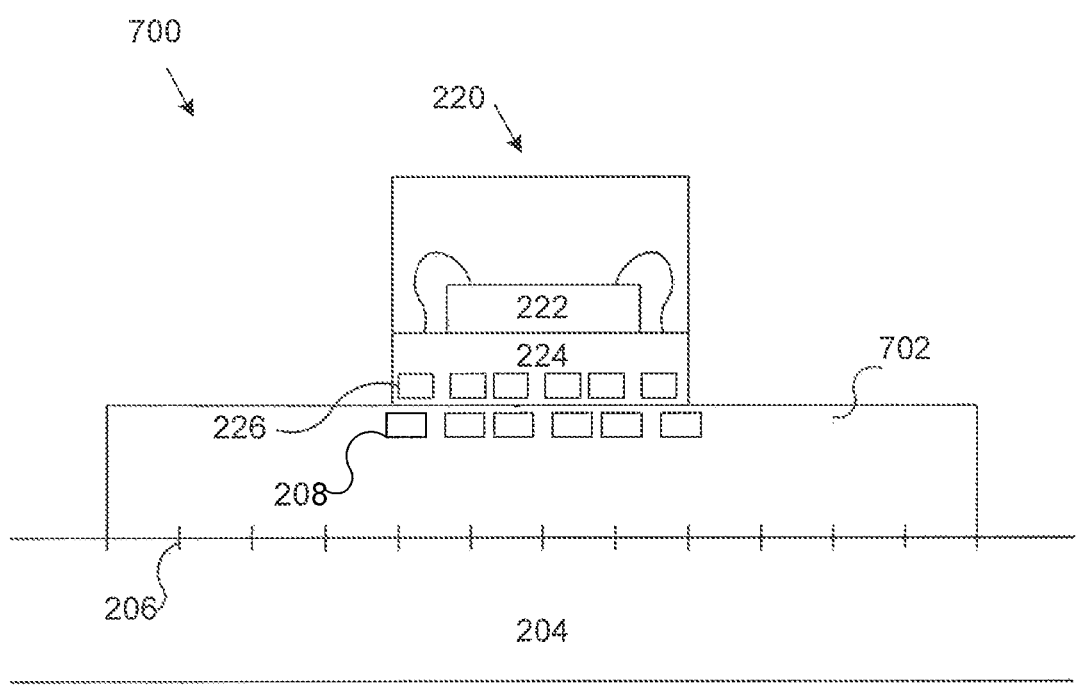
FIG. 7 shows a cross-sectional view of a test board, according to an embodiment of the present invention.

When ohmic contact is not required, these registration requirements can be relaxed. For example, when a testing board communicates with an IC device through wirelessly enabled functional blocks according to embodiments described herein, registration requirements can be relaxed. Thus, other types of test modules can be used instead of sockets, which are generally used to ensure strict registration. For example, FIG. 7 shows a test board 700, according to an embodiment of the present invention. Test board 700 is substantially similar to testing board 200 except that socket 202 is replaced with a platform 702. In other words, FIG. 7 shows an embodiment in which the test module is a platform. Platform 702 includes first wirelessly enabled functional blocks 208 that configured to communicate with respective ones of second wirelessly enabled functional blocks 226 of IC device 220.

Figure 8:
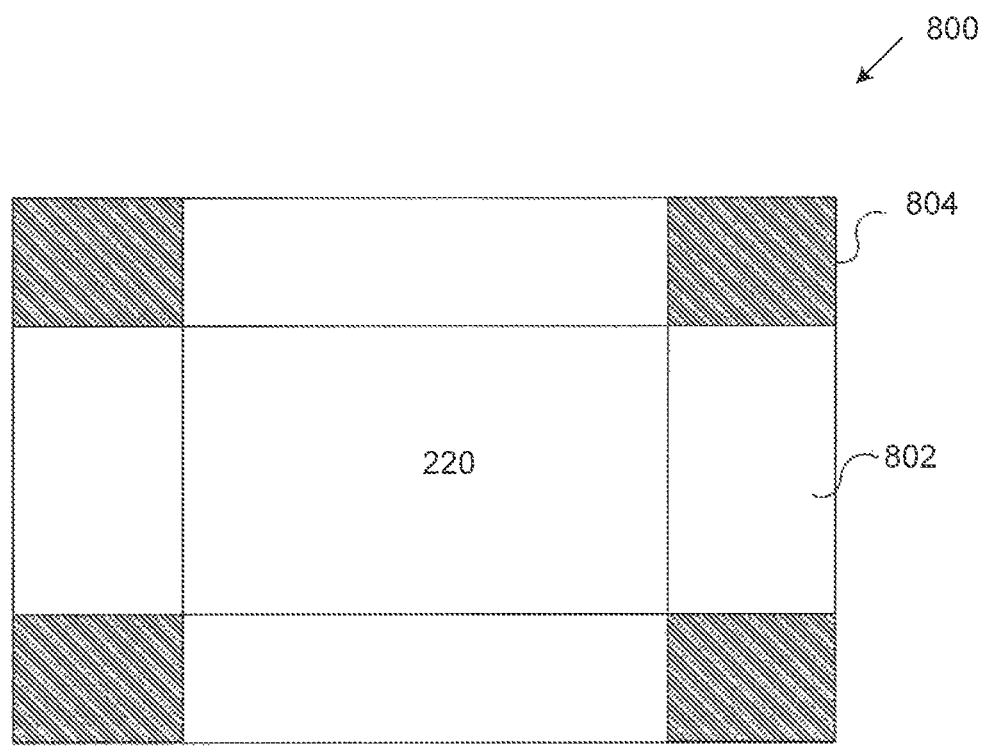
FIG. 8 shows a top view of a test board, according to an embodiment of the present invention.

FIG. 8 shows a top view of a test board 800, according to an embodiment of the present invention. Test board 800 is substantially similar to testing board 700 except that test board 800 includes a platform 802 that includes posts 804. Posts 804 are configured to be aligned with corners of IC device 220 and aid in aligning IC device 220 to test board 800.

FIGS. 2, 7, and 8 thus provide different embodiments of test modules for testing boards. Those skilled in the relevant arts will recognize that still other types of test modules can be used without departing from the scope and spirit of the present invention.

Figure 3:
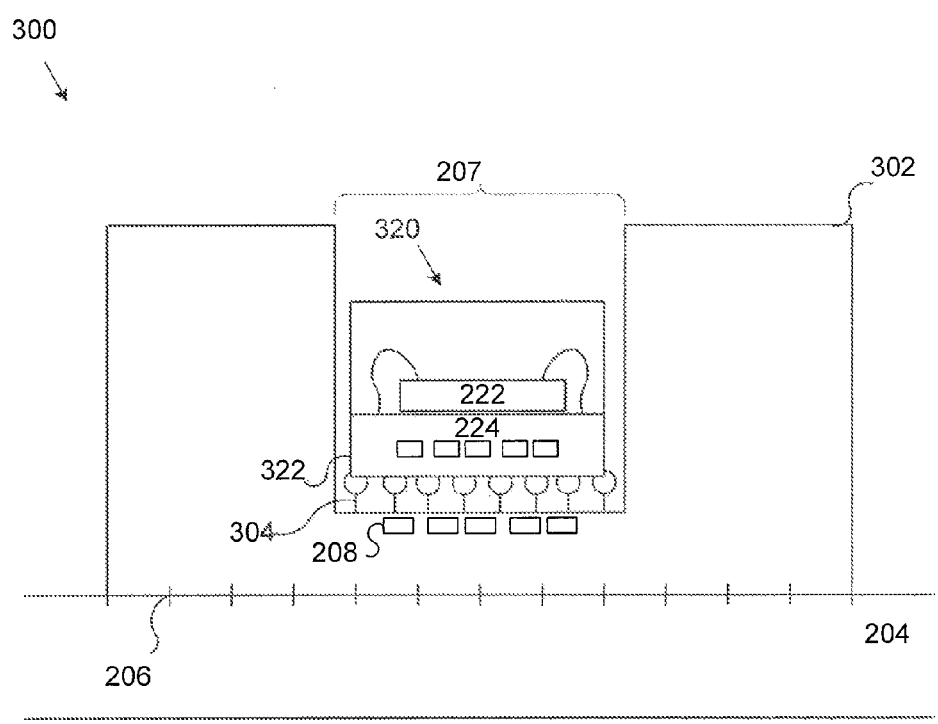
FIG. 3 shows a cross-sectional view of a test board, according to another embodiment of the present invention.

As shown in FIG. 2, socket 202 uses only wirelessly enabled functional blocks to communicate with IC device 200. FIG. 3 shows a test board 300, according to another embodiment of the present invention. Test board 300 includes a socket 302 and circuit board 204.

Test board 300 is substantially similar to test board 200. Unlike test board 200, however, socket 302 includes first wirelessly enabled functional blocks 208 and pins 304. Thus, test board 300 can be used to test IC devices using both wireless signals and ohmic contact. For example, test board 300 can be used to test the operation of an IC device 320, which includes IC die 222, substrate 224, second wirelessly enabled functional blocks 226, and solder balls 322. Pins 304 are configured to contact respective ones of solder balls 322, thereby establishing ohmic contact with IC device 322.

Testing of IC device 320 using test board 300 can be similar to testing of IC device 220 using test board 200. For example, in one embodiment, some signals can be sent to IC device 320 wirelessly and others can be sent through ohmic contact. For example, I/O signals can be sent to IC device 320 using first wirelessly enabled functional blocks 208 and power and ground signals can be sent to IC device 320 using pins 304.

Figure 4:
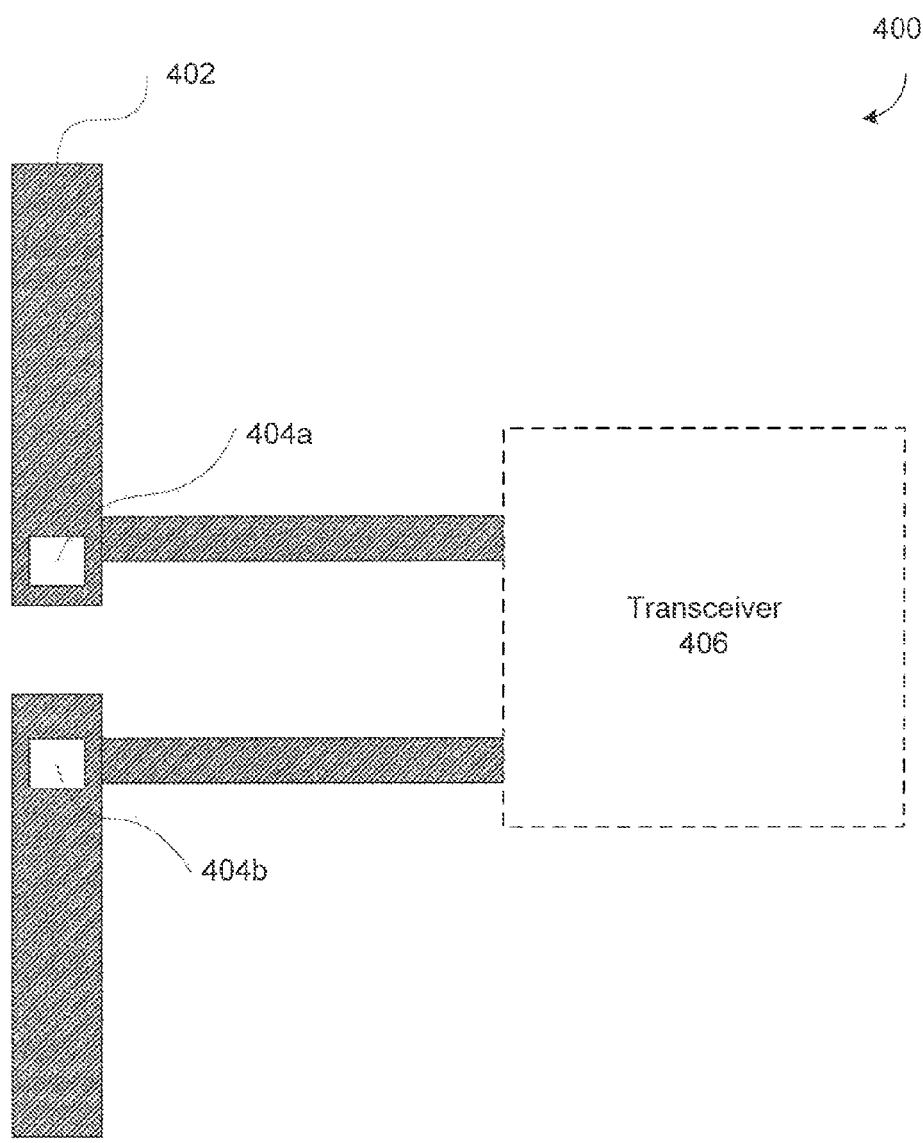
FIG. 4 shows a block diagram of a wirelessly enabled functional block, according to an embodiment of the present invention.

FIG. 4 shows a diagram of a wirelessly enabled functional block 400, according to an embodiment of the present invention. Wirelessly enabled functional block 400 includes an antenna 402 and vias 404a and 404b (collectively "404"), which feed antenna 402. At least one of vias 404 may be a through silicon via. One or more of first and second wirelessly enabled functional blocks 208 and 226 can be implemented in a manner substantially similar to wirelessly enabled functional block 400.

As shown in FIG. 4, antenna 402 is a dipole antenna. Other antenna configurations can be used as appropriate. In one embodiment, antenna 402 can be formed out of metal traces or planes. For example, dipole antenna 402 can be formed using traces on the bottom surface of IC die 222 or on the top surface of socket 200, socket 300, platform 700, or platform 800. Antenna 402 can be configured to operate in a certain frequency range (e.g., by adjusting the dimensions of antenna 302). In other embodiments, antenna 402 can be another type of antenna. For example, antenna 402 can be a patch antenna having a square or rectangular shape.

Vias 404 can be used to drive antenna with a single ended signal or a differential signal. For example, via 404a can be coupled to a signal plane and via 404b can be coupled to a circuit block or other element that provides a single-ended signal. Alternatively, each of vias 404 can be coupled to circuit blocks or other elements that provide components of a differential signal. In still another embodiment, each of vias 404 can be coupled to respective pins (e.g., of a socket).

As shown in FIG. 4, wirelessly enabled functional block 400 optionally includes a transceiver 406. In such an embodiment, antenna 402 is fed by transceiver 406. Transceiver 406 can be coupled to a signal plane using vias of a die or substrate. In one embodiment, transceiver 406 is also coupled to a circuit block or a portion of a circuit board. Transceiver 406 can be configured to transmit signals received from the circuit block or the circuit board and/or convey received signals to the circuit block or the circuit board. In a further embodiment, transceiver 406 can have additional functionality. For example, transceiver 406 may be capable of performing signal processing tasks such as modulation and demodulation.

Figure 5:
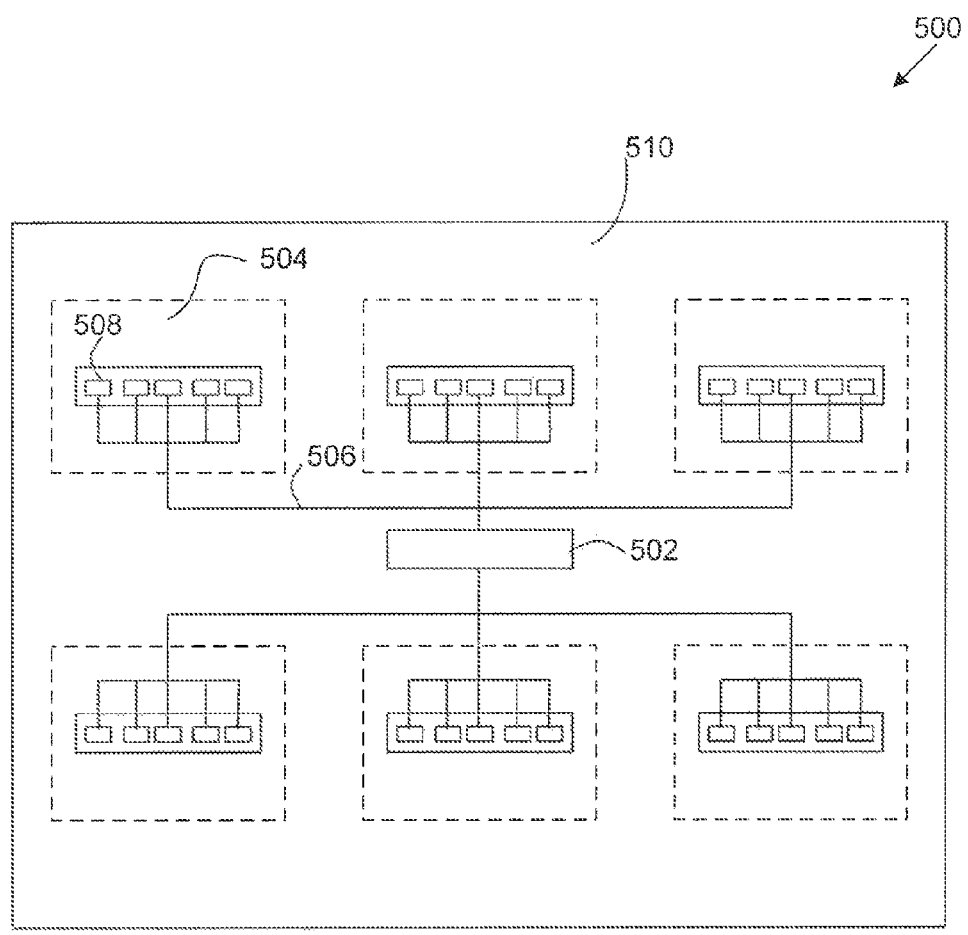
FIG. 5 shows a top view of a test board, according to an embodiment of the present invention.

FIG. 5 shows a top view of a test board 500, according to an embodiment of the present invention. Test board 500 includes a testing controller 502 and neighborhood blocks 504. Testing controller 502 is electrically coupled to neighborhood blocks 504 through radio frequency (RF) busses 506. The elements of test board 500 can be formed on a circuit board 510.

Each of neighborhood blocks 504 includes test modules 508. One or more of test modules 508 can be substantially similar to socket 200, socket 300, platform 700, or platform 800.

In operation, testing controller 502 generates signals used to test IC devices. For example, testing controller 502 can generate power, ground, and I/O signals. These signals are transmitted to selected ones of neighborhood blocks 504 and selected ones of test modules 508 over RF buses 506. Once the signals are received at one of test modules 508, one or more of wirelessly enabled functional blocks, pins, or other connection elements, can be used to transmit the signals to the IC device being transmitted. Similarly, signals generated by the IC device can be received by the test module and transmitted to testing controller 502 over RF buses 506.

FIG. 5 shows each of RF buses 506 as a single element (e.g., a single trace) for the sake of clarity. As would be appreciated by those skilled in the art based on the disclosure herein, each of RF buses 506 can include multiple elements (e.g., multiple traces). Moreover, RF buses 506 can be configured to carry RF signals. For example, RF buses 506 can be sized so that they can carry RF signals.

Figure 6:
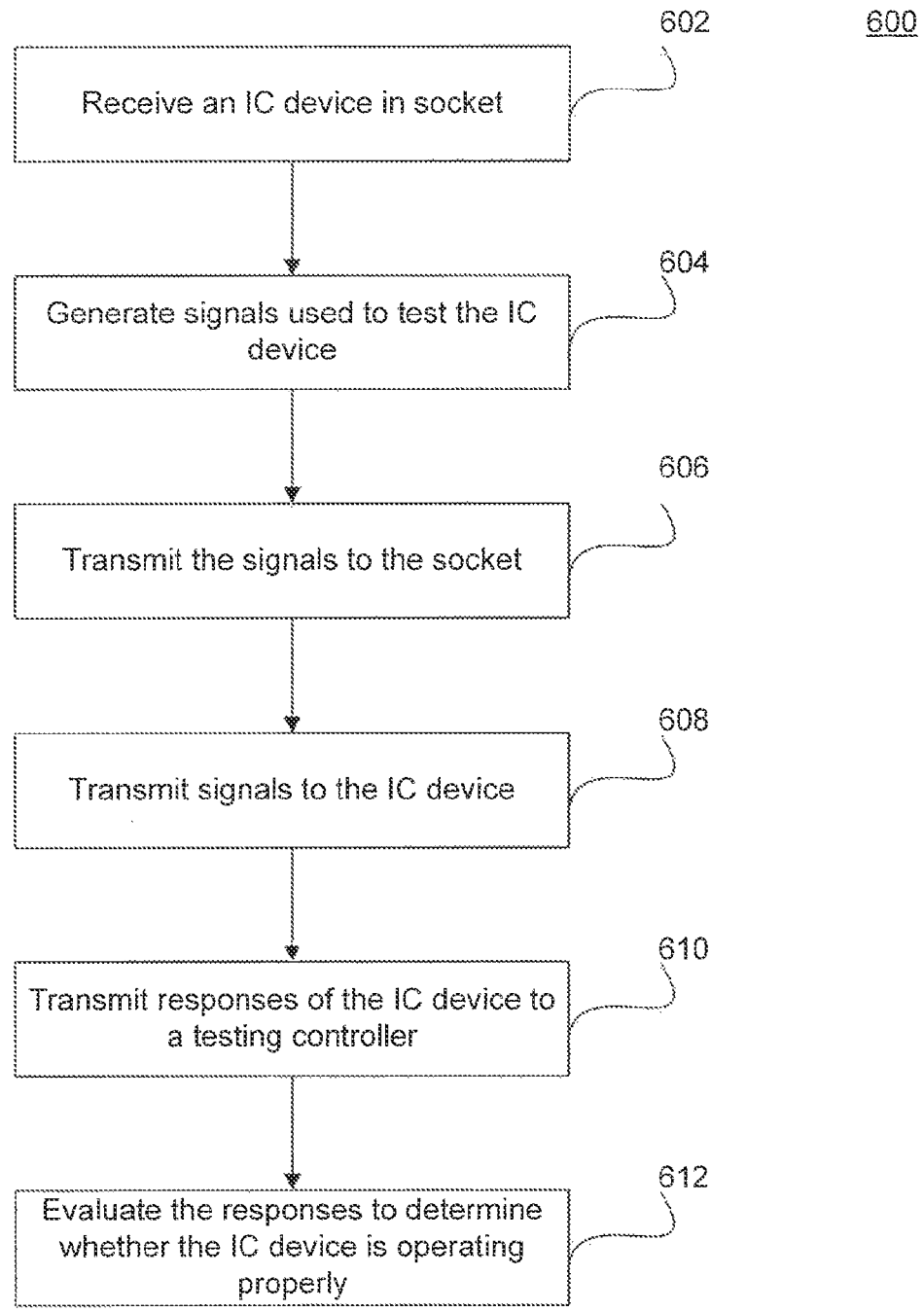
FIG. 6 shows a flowchart providing example steps for testing an IC device according to an embodiment of the present invention.

FIG. 6 shows a flowchart 600 providing example steps for testing an IC device. Other structural and operational embodiments will be apparent to persons skilled in the relevant art(s) based on the following discussion. The steps shown in FIG. 6 do not necessarily have to occur in the order shown. The steps of FIG. 6 are described in detail below.

In step 602, an IC device is received in a test module. For example, in FIG. 2, IC device 220 is received in socket 202. Alternatively, IC device 220 can be received on a platform such as platform 700 or platform 800 shown in FIGS. 7 and 8, respectively.

In step 604, signals used to test the IC device are generated. For example, in FIG. 5, testing controller 502 can generate power, ground, and I/O signals used to test an IC device.

In step 606, the signals are transmitted to the test module. For example, in FIG. 5, the signals can be transmitted to one or more of test modules 508 using one or more of RF traces 506.

In step 608, the signals are transmitted to the IC device. For example, in FIG. 3, one or both of first wirelessly enabled functional blocks 208 and pins 304 can be used to transmit the signals to IC device 320. For example, transceivers of first wirelessly enabled functional blocks 208 can receive the signals and generate respective wireless signals (e.g., by performing modulation and other signal processing operations).

In step 610, responses from the IC device are transmitted to a testing controller. For example, in FIG. 5, RF buses 506 can be used to transmit responses from the IC device being tested to testing controller 502.

In step 612, the responses are evaluated to determine whether the IC device is operating properly. For example, in FIG. 5, testing controller 502 can compare the received responses to a set of expected responses to determine if the IC device is operating properly.

CONCLUSION

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

What is claimed is:

1. A test board, comprising:
   a test module configured to accommodate an integrated circuit (IC) device, the IC device including an IC die;
   first wirelessly enabled functional blocks located in the test module and configured to communicate with second wirelessly enabled functional blocks of the IC device, the second wirelessly enabled functional blocks being electrically coupled to the IC die; and
   a controller configured to control the first wirelessly enabled functional blocks to transmit respective signals to respective ones of the second wirelessly enabled functional blocks to test an operation of the IC device.

2. The test board of claim 1, farther comprising:
   a circuit board; and
   a pin that couples the test module to the circuit board, wherein the pin is electrically coupled to a wirelessly enabled functional block of the first wirelessly enabled functional blocks.

3. The test board of claim 2, wherein the circuit board comprises:
   a wireless bus coupled to the pin.

4. The test board of claim 1, further comprising:
   a second test module configured to accommodate a second IC device; and
   a wireless bus coupled to at least one pin of the test module and at least one pin of the second test module.

5. The test board of claim 1, further comprising:
   connection elements located in the test module and configured to be coupled to connection elements of the IC device.

6. The test board of claim 5, wherein the connection elements of the test module comprise a pin.

7. The test board of claim 6, wherein the connection elements of the IC device comprise a solder ball.

8. The test board of claim 6, wherein the pin is configured to provide a power signal or a ground signal.

9. The test board of claim 1, wherein each of the first wirelessly enabled functional blocks comprises an antenna.

10. The test board of claim 9, wherein each of the first wirelessly enabled functional blocks farther comprises a transceiver.

11. The test board of claim 9, wherein at least one of the antennas is a dipole antenna.

12. The test board of claim 1, Wherein the test module comprises a socket.

13. The test board of claim 1, wherein the test module comprises a platform.

14. The test board of claim 13, wherein the test module further comprises a post.

15. A method of testing an integrated circuit (IC) device coupled to a test module of a test board, wherein the test module comprises first wirelessly enabled functional blocks and wherein the IC device comprises second wirelessly enabled functional blocks, comprising:
   generating a signal using a controller;
   transmitting the signal from at least one of the first wirelessly enabled functional blocks to at least one of the second wirelessly enabled functional blocks;
   receiving a response to the signal generated by the IC device at the test board through a first wirelessly enabled functional block; and
   evaluating the response using the controller to determine whether the IC device is operating properly.

16. The method of claim 15, further comprising:
   transmitting the signal to the test module using a wireless bus.

17. The method of claim 15, further comprising:
   transmitting the response to the controller using a wireless bus.

18. The method of claim 15, wherein the testing module comprises a connection element, further comprising:
   transmitting a second signal to the IC device using the connection element.

19. The method of claim 18, wherein the second signal is a power signal or a ground signal.

20. The method of claim 15, wherein transmitting comprises:
   generating a wireless signal corresponding to the signal using the at least one of the first wirelessly enabled functional blocks.

* * * * *

UNITED STATES PATENT AND TRADEMARK OFFICE
CERTIFICATE OF CORRECTION

PATENT NO. : 8,901,945 B2  
APPLICATION NO. : 13/149315  
DATED : December 2, 2014  
INVENTOR(S) : Zhao et al.

Page 1 of 1

It is certified that error appears in the above-identified patent and that said Letters Patent is hereby corrected as shown below:

In the Claims

In column 7, line 28, Claim 1, replace "farther" with --further--.

In column 8, line 6, Claim 10, replace "farther" with --further--.

In column 8, line 10, Claim 12, replace "Wherein" with --wherein--.

Signed and Sealed this
Nineteenth Day of May, 2015

Michelle K. Lee
*Director of the United States Patent and Trademark Office*